US011315955B2

(12) United States Patent
Lee et al.

(10) Patent No.: US 11,315,955 B2
(45) Date of Patent: Apr. 26, 2022

(54) THIN FILM TRANSISTOR SUBSTRATE, DISPLAY DEVICE HAVING THE SAME, METHOD OF MANUFACTURING THIN FILM TRANSISTOR SUBSTRATE, AND METHOD OF MANUFACTURING DISPLAY DEVICE

(71) Applicant: Samsung Display Co., Ltd., Yongin-si (KR)

(72) Inventors: Kyoungwon Lee, Yongin-si (KR); Taehoon Yang, Yongin-si (KR); Jongchan Lee, Yongin-si (KR); Woonghee Jeong, Yongin-si (KR); Yongsu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/286,744

(22) Filed: Feb. 27, 2019

(65) Prior Publication Data
US 2019/0280021 A1    Sep. 12, 2019

(30) Foreign Application Priority Data

Mar. 8, 2018   (KR) .................... 10-2018-0027705

(51) Int. Cl.
*H01L 27/12*   (2006.01)
*H01L 27/32*   (2006.01)
(Continued)

(52) U.S. Cl.
CPC ........ *H01L 27/1233* (2013.01); *H01L 27/127* (2013.01); *H01L 27/1222* (2013.01);
(Continued)

(58) Field of Classification Search
CPC ............. H01L 27/1233; H01L 27/1222; H01L 27/127; H01L 27/1274; H01L 27/1288;
(Continued)

(56) References Cited

U.S. PATENT DOCUMENTS 7,683,897 B2    3/2010 Moon et al.
2003/0094613 A1*  5/2003 Joo ................... H01L 29/78645
                                                        257/59
(Continued)

FOREIGN PATENT DOCUMENTS

JP    09-213630 A    8/1997
JP    2000-124457 A   4/2000
(Continued)

*Primary Examiner* — Mark W Tornow
(74) *Attorney, Agent, or Firm* — Kile Park Reed & Houtteman PLLC

(57) ABSTRACT

A thin film transistor substrate, a display device, a method of manufacturing a thin film transistor substrate, and a method of manufacturing a display device, the thin film transistor substrate including a substrate; a first thin film transistor on the substrate, the first thin film transistor including a first active pattern, and a first gate electrode arranged to overlap at least a part of the first active pattern; and a second thin film transistor on the substrate, the second thin film transistor including a second active pattern that includes a plurality of protrusions on an upper surface thereof, and a second gate electrode arranged to overlap at least a part of the second active pattern.

16 Claims, 4 Drawing Sheets

(51) Int. Cl.
*H01L 29/786* (2006.01)
*H01L 29/66* (2006.01)

(52) U.S. Cl.
CPC ...... *H01L 27/1274* (2013.01); *H01L 27/1288* (2013.01); *H01L 29/66757* (2013.01); *H01L 29/78675* (2013.01); *H01L 29/78696* (2013.01); *H01L 27/3262* (2013.01); *H01L 2227/323* (2013.01)

(58) Field of Classification Search
CPC ......... H01L 29/66757; H01L 29/78675; H01L 29/78696
See application file for complete search history.

(56) References Cited

U.S. PATENT DOCUMENTS

| | | | | |
|---|---|---|---|---|
| 2004/0155245 | A1* | 8/2004 | Okumura | H01L 29/78675 257/66 |
| 2005/0233575 | A1* | 10/2005 | Abe | H01L 29/78675 438/622 |
| 2008/0035933 | A1* | 2/2008 | Nagata | H01L 29/66757 257/72 |
| 2008/0142808 | A1* | 6/2008 | Lee | H01L 27/1214 257/72 |
| 2015/0159300 | A1* | 6/2015 | Cho | H01L 27/1222 257/40 |

FOREIGN PATENT DOCUMENTS

| | | |
|---|---|---|
| KR | 10-1034776 B1 | 5/2011 |
| KR | 10-2015-0065391 A | 6/2015 |
| KR | 10-2016-0135081 A | 11/2016 |

\* cited by examiner

THIN FILM TRANSISTOR SUBSTRATE, DISPLAY DEVICE HAVING THE SAME, METHOD OF MANUFACTURING THIN FILM TRANSISTOR SUBSTRATE, AND METHOD OF MANUFACTURING DISPLAY DEVICE

CROSS-REFERENCE TO RELATED APPLICATION

Korean Patent Application No. 10-2018-0027705, filed on Mar. 8, 2018, in the Korean Intellectual Property Office, and entitled: "Thin Film Transistor Substrate, Display Device Having the Same, Method of Manufacturing Thin Film Transistor Substrate, and Method of Manufacturing Display Device," is incorporated by reference herein in its entirety.

BACKGROUND

1. Field

Embodiments relate to a thin film transistor substrate, a display device having the thin film transistor substrate, a method of manufacturing the thin film transistor substrate, and a method of manufacturing the display device.

2. Description of the Related Art

Transistors may be used in various electronic devices for various purposes. For example, a transistor may be used as a switching device, a driving device, a photo sensing device, or the like, and may be also used as a component of various electronic circuits.

Among these transistors, a CMOS thin film transistor may be provided with a PMOS thin film transistor and an NMOS thin film transistor and may be advantageous in realizing various circuits and systems that are difficult to realize by using only a PMOS thin film transistor or an NMOS thin film transistor.

SUMMARY

Embodiments are directed to a thin film transistor substrate, a display device having the thin film transistor substrate, a method of manufacturing the thin film transistor substrate, and a method of manufacturing the display device.

The embodiments may be realized by providing a thin film transistor substrate including a substrate; a first thin film transistor on the substrate, the first thin film transistor including a first active pattern, and a first gate electrode arranged to overlap at least a part of the first active pattern; and a second thin film transistor on the substrate, the second thin film transistor including a second active pattern that includes a plurality of protrusions on an upper surface thereof, and a second gate electrode arranged to overlap at least a part of the second active pattern.

One of the first thin film transistor and the second thin film transistor may be a P-type transistor, and the other of the first thin film transistor and the second thin film transistor may be an N-type transistor.

The first thin film transistor and the second thin film transistor may constitute a CMOS device.

A height of each protrusion of the plurality of protrusions on the upper surface of the second active pattern may be from about 200 Å to about 800 Å.

The thin film transistor substrate may further include a gate insulating layer on the substrate, wherein the gate insulating layer is between the first active pattern and the first gate electrode.

One of the first thin film transistor and the second thin film transistor may be a driving transistor, and the other of the first thin film transistor and the second thin film transistor may be a switching transistor.

An upper surface of the first active pattern may be flat.

The first active pattern may include a plurality of fine protrusions on an upper surface thereof, and a height of each fine protrusion of the plurality of fine protrusions may be about 100 Å or less.

The first active pattern and the second active pattern may include polysilicon.

The embodiments may be realized by providing a display device including the film transistor substrate according to an embodiment; a pixel electrode electrically connected to the first thin film transistor or the second thin film transistor of the thin film transistor substrate; an emission layer arranged on the pixel electrode; and a counter electrode arranged on the emission layer.

The embodiments may be realized by providing a method of manufacturing a thin film transistor substrate, the method including forming a first active pattern and a second active pattern on a substrate; forming a plurality of first protrusions on an upper surface of the first active pattern and forming a plurality of second protrusions on an upper surface of the second active pattern by irradiating a laser beam onto the first active pattern and the second active pattern; forming a masking layer on the second active pattern to cover the second active pattern; removing the plurality of first protrusions on the exposed upper surface of the first active pattern; forming a first gate electrode overlapping at least parts of the first active pattern; and forming a second gate electrode overlapping at least parts of the second active pattern.

One of the first active pattern and the second active pattern may be doped with a P-type dopant, and the other of the first active pattern and the second active pattern may be doped with an N-type dopant.

The method may further include forming a first thin film transistor by doping the first active pattern with a first dopant; and forming a second thin film transistor by doping the second active pattern with a second dopant, wherein one of the first thin film transistor and the second thin film transistor is a PMOS transistor, and the other of the first thin film transistor and the second thin film transistor is an NMOS transistor.

A height of each protrusion of the plurality of first protrusions and the plurality of second protrusions may be from about 200 Å to about 800 Å.

The method may further include forming a gate insulating layer on the substrate, wherein the gate insulating layer is between the first active pattern and the first gate electrode, One of the first thin film transistor and the second thin film transistor may be a driving transistor, and the other of the first thin film transistor and the second thin film transistor may be a switching transistor.

Removing the plurality of first protrusions may include performing an etching process.

Removing the plurality of first protrusions may include performing a CMP process.

Removing the plurality of first protrusions may include forming a plurality of fine protrusions having a height of about 100 Å or less on an upper surface of the first active pattern.

The embodiments may be realized by providing a method of manufacturing a display device, the method including manufacturing a thin film transistor substrate by using the method of manufacturing the thin film transistor substrate according to an embodiment; forming a pixel electrode electrically connected to the first thin film transistor or the second thin film transistor of the thin film transistor substrate; forming an intermediate layer on the pixel electrode, the intermediate layer including an emission layer; and forming a counter electrode on the intermediate layer.

These general and specific aspects may be implemented by using a system, method, computer program, or any combination of systems, methods, and computer programs.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
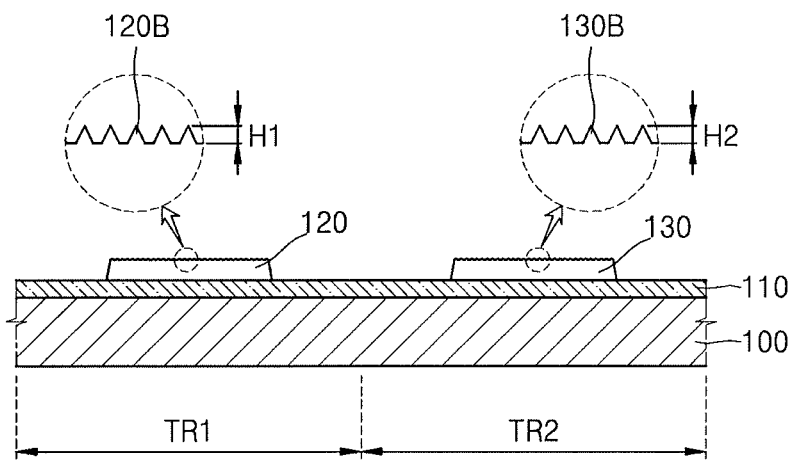
FIGS. 1 to 4 illustrate cross-sectional views of stages in a manufacturing process of a thin film transistor substrate according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the terms "or" and "and/or" include any and all combinations of one or more of the associated listed items. Expressions such as "at least one of," when preceding a list of elements, modify the entire list of elements and do not modify the individual elements of the list.

In the following embodiments, the terms first, second, and etc. are used for the purpose of distinguishing one element from another, not the limitative meaning. The articles "a," "an," and "the" are singular in that they have a single referent, however the use of the singular form in the present document may not preclude the presence of more than one referent.

On the other hand, the terms "comprises", "comprising", "includes", "including" and/or "having" mean that a feature or element described in the specification is present, and does not preclude the possibility that one or more other features or components will be added.

X-axis, y-axis, and z-axis are not limited to three axes on the orthogonal coordinate system, and may be interpreted in a broad sense to include them. For example, the x-, y-, and z-axes may be orthogonal to each other, but may refer to different directions that are not orthogonal to each other.

When it is possible to implement any embodiment in any other way, the particular process sequence may be performed differently from the sequence described. For example, two processes which are described successively may be carried out substantially concurrently or may be carried out in the order reverse to that described.

FIGS. 1 to 4 illustrate cross-sectional views of stages in a manufacturing process of a thin film transistor substrate 100 according to an embodiment of the present disclosure.

Referring first to FIG. 1, a first active pattern 120 and a second active pattern 130 may be formed on the thin film transistor substrate 100. The thin film transistor substrate 100 may be formed of various materials such as a glass material, a metal material, or a plastic material such as polyethylene terephthalate (PET), polyethylene naphthalate (PEN), polyimide, or the like.

The first active pattern 120 may be part of the first thin film transistor TR1, and the second active pattern 130 may be part of the second thin film transistor TR2. In an implementation, a CMOS device may be configured including the first thin film transistor TR1 and the second thin film transistor TR2.

One of the first thin film transistor TR1 and the second thin film transistor TR2 may be a p-type transistor and the other may be an n-type transistor. In an implementation, when the first thin film transistor TR1 is a P-type transistor, the first thin film transistor TR1 may be a PMOS transistor, and when the second thin film transistor TR2 is an N-type transistor, the second thin film transistor TR2 may be an NMOS transistor.

A buffer layer 110 may be formed on the thin film transistor substrate 100 before the first active pattern 120 and the second active pattern 130 are formed. The buffer layer 110 may help block foreign substances or moisture penetrating through the thin film transistor substrate 100. In an implementation, the buffer layer 110 may include an inorganic material such as silicon oxide (SiOx), silicon nitride (SiNx), and/or silicon oxynitride (SiON), and may include a single layer or a multilayer.

In an implementation, the first active pattern 120 and the second active pattern 130 may include, e.g., polysilicon. As such, in the case where the first active pattern 120 and the second active pattern 130 include polysilicon, the first active pattern 120 and the second active pattern 130 may be formed by crystallizing amorphous silicon. Amorphous silicon may be crystallized by various methods such as rapid thermal annealing (RTA), solid phase crystallization (SPC), excimer laser annealing (ELA), metal induced crystallization (MIC), metal induced lateral crystallization (MILC) and sequential lateral solidification (SLS). In an implementation, when the ELA crystallization method is used, an excimer laser in the form of a line beam may be scanned at a constant scan pitch to form polysilicon.

The amorphous silicon may be crystallized into polysilicon through the crystallization process of the first active pattern 120 and the second active pattern 130. In this process, due to a difference in grain size, a plurality of first protrusions 120B and a plurality of second protrusions 130B may be formed on the first active pattern 120 and the second active pattern 130, respectively.

As illustrated in an enlarged view of FIG. 1, the plurality of first protrusions 120B may be formed on an upper surface of the first active pattern 120 and the plurality of second protrusions 130B may be formed on an upper surface of the second active pattern 130. A height H1 of the plurality of first protrusions 120B and a height H2 of the plurality of second protrusions 130B may be, e.g., about 200 Å to about 800 Å. For example, the height may be an orthogonal distance from a plane formed by regions between the protrusions to a level even with the peak of the protrusion.

As a comparative example, if first and second thin film transistors TR1 and TR2 were to be formed while leaving a plurality of first and second protrusions 120B and 130B formed on the upper surfaces of the first and second active patterns 120 and 130 as they are, a dopant may not be uniformly injected into the first and second active patterns 120 and 130 in a subsequent doping process due to a thickness difference in the active pattern caused by the protrusions and a barrier in the active pattern formed thereby, or short range uniformity (SRU) characteristics may be deteriorated. However, the PMOS and NMOS transistors constitute the CMOS device and one of them may have protrusions formed on an upper surface of an active pattern in some cases, thereby improving device characteristics. In this case, one of the PMOS and NMOS transistors that constitute one CMOS device may be selectively provided with a protrusion, or there may be selectively a need to remove the protrusion.

Figure 2:
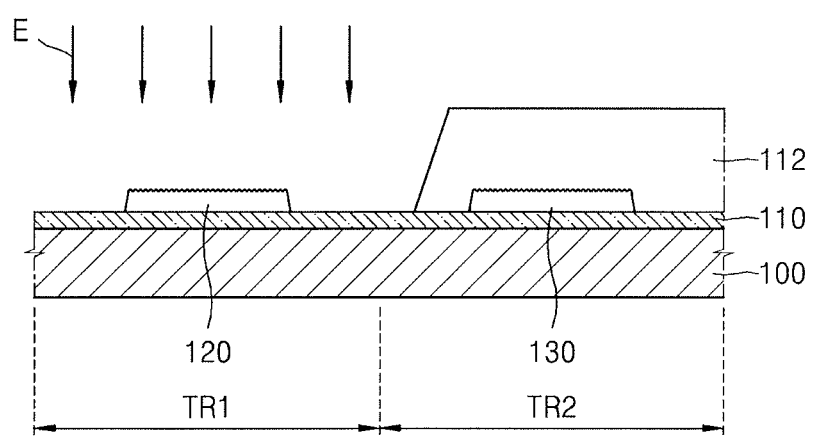

Referring to FIG. 2, a masking layer 112 may be formed on the second active pattern 130. FIG. 2 illustrates when the masking layer 112 is, e.g., a photoresist. In an implementation, a shadow mask or the like may be used as the masking layer 112. When a photoresist is used as the masking layer 112, the photoresist may be entirely coated on the first active pattern 120 and the second active pattern 130, and then a portion of the photoresist formed on the first active pattern 120 may be removed through patterning.

Afterwards, protrusions may be removed on an upper surface of the first active pattern 120. Various methods such as a physical method or a chemical method may be used as a method for removing the protrusions. In an implementation, the plurality of first protrusions 120B on the upper surface of the first active pattern 120 may be removed through an etching step (E). In the etching step (E), various methods such as a poly etchant and aching may be used. The poly etchant may be an etchant capable of etching polysilicon, and may include, e.g., a mixed solution of nitric acid, hydrofluoric acid, water, and other additives.

In an implementation, the plurality of first protrusions 120B on the upper surface of the first active pattern 120 may be removed through a chemical mechanical polishing (CMP) process.

In the process of removing the plurality of first protrusions 120B on the upper surface of the first active pattern 120, the second active pattern 130 may be covered with the masking layer 112, and the second active pattern 130 may not be affected by an etching process (E) or a CMP process for removing the plurality of first protrusions 120B on the upper surface of the first active pattern 120. For example, only the plurality of first protrusions 120B on the upper surface of the first active pattern 120 may be selectively removed, and not a portion covered with the masking layer 112.

In an implementation, after the plurality of first protrusions 120B on the upper surface of the first active pattern 120 are removed, a doping process (D) may be performed on the first active pattern 120 without removing the masking layer 112.

Figure 3:
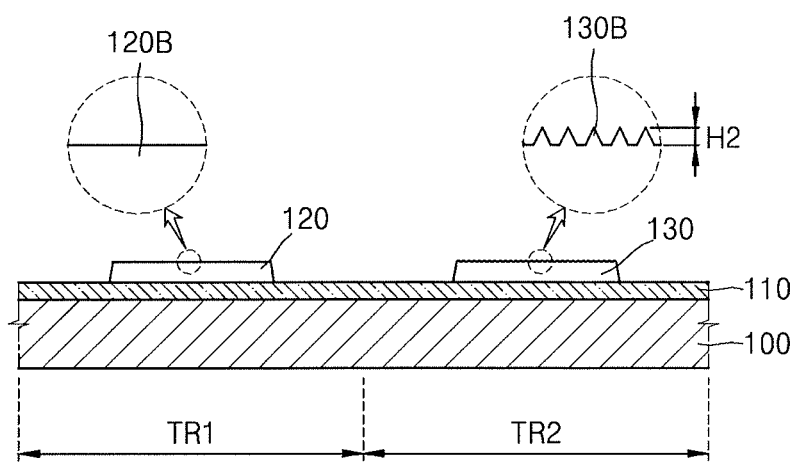

Referring to FIG. 3, after the plurality of first protrusions 120B on the upper surface of the first active pattern 120 are removed, the masking layer 112 covering the second active pattern 130 may be removed. The second active pattern 130 from which the masking layer 112 is removed may not be exposed to the outside in the process of removing the plurality of first protrusions 120B of the first active pattern 120, and thus the plurality of second protrusions 130B on the upper surface of the second active pattern 130 may remain unchanged. An upper surface of the first active pattern 120 of FIG. 3 may be flat with the plurality of first protrusions 120B removed, and an upper surface of the second active pattern 130 may be formed with a plurality of second protrusions 130B.

Figure 4:
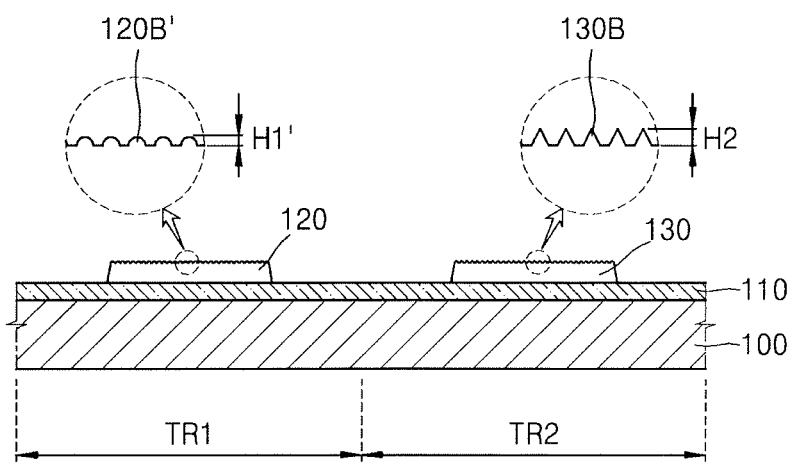

In an implementation, referring to FIG. 4, after removing a plurality of first protrusions 120B on the upper surface of the first active pattern 120, the masking layer 112 covering the second active pattern 130 may be removed. In an implementation, the upper surface of the first active pattern 120 may not be completely flat in the process of removing the plurality of first protrusions 120B on the top surface of the first active pattern 120. For example, there may be a plurality of fine protrusions 120B' on the upper surface of the first active pattern 120. The plurality of fine protrusions 120B' may have a lower or lesser height than the plurality of second protrusions 130B of the second active pattern 130. In an implementation, a height H1' of the plurality of fine protrusions 120B' may be, e.g., about 100 Å or less, and the plurality of second protrusions 130B may be, e.g., about 200 Å to 800 Å.

Referring to FIG. 4, a first thin film transistor TR1 and a second thin film transistor TR2 including a first active pattern 120 and a second active pattern 130, respectively, formed through the above-described process may be formed.

To form the first thin film transistor TR1, the first active pattern 120 (in which the protrusions have been removed) may be doped. Furthermore, to form the second thin film transistor TR2, the second active pattern 130 may be doped. In an implementation, one of the first active pattern 120 and the second active pattern 130 may be doped with a P-type dopant and the other may be doped with an N-type dopant.

In an implementation, when the first active pattern 120 is doped with a first dopant including a P-type dopant, the first thin film transistor TR1 including the first active pattern 120 may be a PMOS transistor. In an implementation, when the second active pattern 130 is doped with a second dopant including an N-type dopant, the second thin film transistor TR2 including the second active pattern 130 may be an NMOS transistor. As such, a device including the first thin film transistor TR1 and the second thin film transistor TR2 may be driven as a CMOS device.

The first thin film transistor TR1 may include a first gate electrode 122, and a first source electrode 124S and a first drain electrode 124D on the first active pattern 120. In an implementation, the second thin film transistor TR2 may include a second gate electrode 132, and a second source electrode 134S and a second drain electrode 134D on the second active pattern 130. A detailed structure of the first thin film transistor TR1 and the second thin film transistor TR2 will be described in detail with reference to FIG. 5.

After the first and second thin film transistors TR1 and TR2 are formed, a light emitting device 300 may be formed and may be directly connected to at least one of the first and second thin film transistors TR1 and TR2. The light emitting device 300 may be formed by sequentially forming a pixel electrode 310, an intermediate layer 320, and a counter electrode 330. A specific configuration of the light emitting device 300 will be described in detail with reference to FIG. 5.

Figure 5:
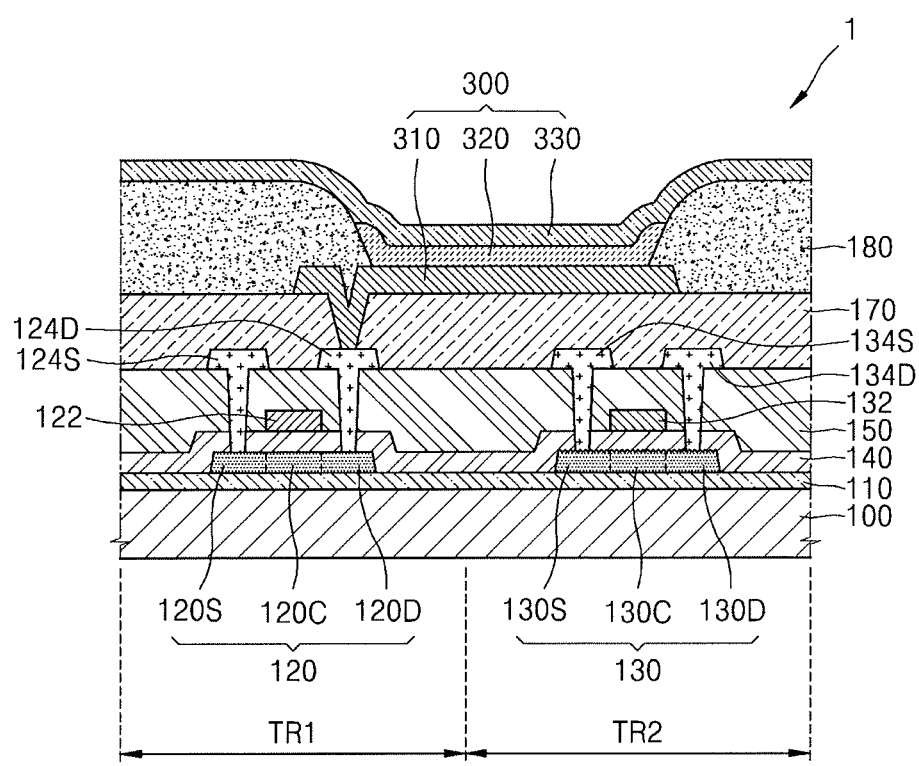
FIG. 5 illustrates a cross-sectional view of a display device including a thin film transistor substrate according to another embodiment of the present disclosure.

FIG. 5 illustrates a configuration in which the first thin film transistor TR1 is electrically connected to the pixel electrode 310. In an implementation, the first thin film transistor TR1 may function as a driving transistor and the second thin film transistor TR2 may function as a switching transistor. In this case, the switching transistor may include an active pattern in which a plurality of protrusions is formed on an upper surface thereof.

In an implementation, the second thin film transistor TR2 may be electrically connected to the pixel electrode 310. The first thin film transistor TR1 may function as a switching transistor and the second thin film transistor TR2 may function as a driving transistor. In this case, the driving transistor may include an active pattern in which a plurality of protrusions is formed on an upper surface thereof.

A manufacturing method of the thin film transistor substrate 100 and a manufacturing method of a display device including the thin film transistor substrate 100 have been described so far. In an implementation, the thin film transistor substrate 100 may be manufactured by the manufacturing method of the thin film transistor substrate 100 and the display device may be manufactured by the manufacturing method of the display device.

Figure 6:
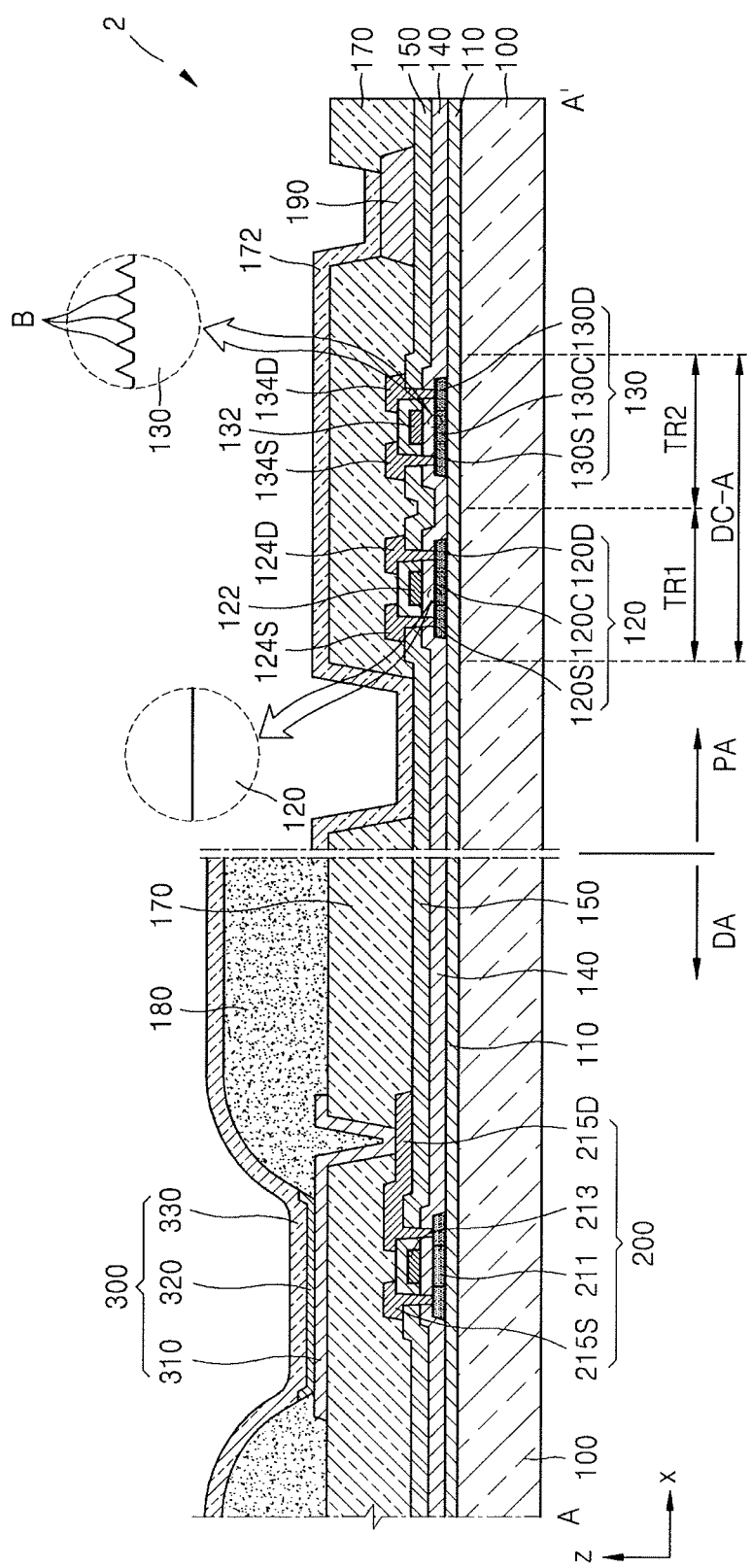
FIG. 6 illustrates a cross-sectional view of a display device including a thin-film transistor substrate according to another embodiment of the present disclosure.

FIG. 5 illustrates a cross-sectional view of a display device 1 including a thin film transistor substrate 100 according to another embodiment of the present disclosure, and FIG. 6 illustrates a cross-sectional view of a display device 2 including a thin film transistor substrate 100 according to another embodiment of the present disclosure.

The following display devices may be devices for displaying an image, and may include, e.g., a liquid crystal display device, an electrophoretic display device, an organic light emitting display device, an inorganic light emitting display device, a field emission display, a surface-conduction electron-emitter display, a plasma display, a cathode ray display, or the like.

Hereinafter, a display device according to an embodiment of the present disclosure will be described as an organic light emitting display device. In an implementation, the display device of the present disclosure may be display devices of various types.

The thin film transistor substrate 100 may be formed of various materials such as a glass material, a metal material, or a plastic material such as PET, polyethylene naphthalate (PEN), polyimide, or the like. The thin film transistor substrate 100 may have a display area where a plurality of pixels are arranged to display an image, and an peripheral area surrounding the display area.

The thin film transistor substrate 100 may include at least one pixel providing an image thereof, and the pixel may include a wiring part including a gate line, a data line, and a driving voltage line, and a first thin film transistor TR1, a second thin film transistor TR2, and a light emitting device 300 connected to the wiring part.

In an implementation, as illustrated in FIG. 5, the first thin film transistor TR1 may be a driving transistor and the second thin film transistor TR2 may be a switching transistor. In an implementation, the first thin film transistor TR1 may be a switching transistor and the second thin film transistor TR2 may be a driving transistor.

In an implementation, the first thin film transistor TR1 may include a first active pattern 120 and a first gate electrode 122 overlapping at least part of the first active pattern 120. In an implementation, the second thin film transistor TR2 may include a second active pattern 130 and a second gate electrode 132 overlapping at least part of the second active pattern 130. In an implementation, the first active pattern 120 and the second active pattern 130 may be formed by the manufacturing process of FIGS. 1 to 3 described above. The first and second active patterns 120 and 130 may include, e.g., a polysilicon material.

The buffer layer 110 may be formed on the thin film transistor substrate 100. The buffer layer 110 may help block foreign substances or moisture penetrating through the thin film transistor substrate 100. For example, the buffer layer 110 may include an inorganic material such as silicon oxide (SiOx), silicon nitride (SiNx), and/or silicon oxynitride (SiON), and may include a single layer or a multilayer. The first active pattern 120 and the second active pattern 130 may be provided on the buffer layer 110 formed on the thin film transistor substrate 100.

The first active pattern 120 may include a channel region 120C overlapping the first gate electrode 122, and a source region 120S and a drain region 120D that are arranged respectively on opposite sides of the channel region 120C and have a higher impurity concentration (dopant) than that of the channel region 120C. In an implementation, the impurity may include an N-type impurity or a P-type impurity. The source region 120S and the drain region 120D may be electrically connected to the first source electrode 124S and the first drain electrode 124D of the first thin film transistor TR1.

The second active pattern 130 may include a channel region 130C overlapping the second gate electrode 132, and a source region 130S and a drain region 130D that are arranged respectively on opposite sides of the channel region 130C and have a higher impurity concentration (dopant) than that of the channel region 130C. In an implementation, the impurity may include an N-type impurity or a P-type impurity. The source region 130S and the drain region 130D may be electrically connected to the second source electrode 134S and the second drain electrode 134D of the second thin film transistor TR2.

In an implementation, when the first active pattern 120 includes an N-type impurity, the second active pattern 130 may include a P-type impurity. For example, one of the first thin film transistor TR1 and the second thin film transistor TR2 may be a PMOS transistor and the other may be an NMOS transistor.

In this case, the gate insulating layer 140 may be arranged between the first gate electrode 122 and the first active pattern 120 and between the second gate electrode 132 and the second active pattern 130 to secure insulation therebetween. In an implementation, the gate insulating layer 140 may be an inorganic insulating layer such as silicon oxynitride (SiON), silicon oxide (SiOx), and/or silicon nitride (SiNx), and the inorganic insulating layer may be a single layer or a multilayer.

An interlayer insulating layer 150 may be formed to cover upper surfaces of the first gate electrode 122 and the second gate electrode 132. In an implementation, the interlayer insulating layer 150 may include an inorganic insulating layer such as silicon oxynitride (SiON), silicon oxide (SiOx), and/or silicon nitride (SiNx), and the inorganic insulating layer may be a single layer or a multilayer. As illustrated in FIG. 5, the buffer layer 110, the gate insulating layer 140, and the interlayer insulating layer 150 may be arranged on an entire surface of the thin film transistor substrate 100.

The first thin film transistor TR1 may include the first source electrode 124S and the first drain electrode 124D electrically connected to the first active pattern 120 through a contact hole formed in the gate insulating layer 140 and the interlayer insulating layer 150. The contact hole may pass through both the gate insulating layer 140 and the interlayer insulating layer 150 continuously, and a part of the source region 120S and the drain region 120D of the first active pattern 120 may be exposed through the contact hole. The first source electrode 124S may be electrically connected to the source region 120S of the first active pattern 120 through the contact hole formed in the gate insulating layer 140 and the interlayer insulating layer 150, and the first drain electrode 124D may be electrically connected to the drain region 120D of the first active pattern 120 through the contact hole formed in the gate insulating layer 140 and the interlayer insulating layer 150.

Likewise, the second thin film transistor TR2 may include a second source electrode 134S and a drain electrode 134D electrically connected to the second active pattern 130 through a contact hole formed in the gate insulating layer 140 and the interlayer insulating layer 150.

The first and second source electrodes 124S and 134S and the first and second drain electrodes 124D and 134D may be formed of one or more materials of, e.g., aluminum (Al), platinum (Pt), palladium (Pd), silver (Ag), nickel (Ni), neodymium (Nd), iridium (Ir), chromium (Cr), lithium (Li), calcium (Ca), molybdenum (Mo), titanium (Ti), Tungsten (W), and copper (Cu).

A via layer 170 may be arranged on the first thin film transistor TR1 and the second thin film transistor TR2. In this case, the via layer 170 may be a planarizing film or a protective film. When the organic light emitting diode is arranged on the first and second thin film transistors TR1 and TR2, the via layer 170 may help substantially flatten the upper surface of the thin film transistors and may protect the thin film transistors and various elements. The via layer 170 may include, e.g., an organic insulating material. The organic insulating material may include general purpose polymers such as imide polymers, polymethylmethacrylate (PMMA) and polystyrene (PS), polymer derivatives having a phenolic group, acrylic polymers, arylether polymers, amide polymers, fluorine polymers, p-xylene polymers, vinyl alcohol-based polymers, and blends thereof, and the like. In an implementation, the via layer 170 may include polyimide materials.

In an implementation, a protective film covering a thin film transistor TFT may be included to protect the thin film transistor TFT of such a structure. The protective film may be formed of an inorganic material, e.g., silicon oxide, silicon nitride, or silicon oxynitride.

The pixel electrode 310 may be arranged on the via layer 170. A pixel defining layer 180 may be arranged on the pixel electrode 310. The pixel defining layer 180 may define a pixel by an opening corresponding to each sub-pixel and exposing at least a central portion of the pixel electrode 310. In an implementation, the pixel defining layer 180 may increase a distance between an edge of the pixel electrode 310 and the counter electrode 330, thereby preventing the generation of an arc or the like therebetween. The pixel defining layer 180 may be formed of an organic material, e.g., polyimide or hexamethyldisiloxane (HMDSO).

The intermediate layer 320 of the light emitting device 300 may include a low molecular weight or high molecular weight material. When the intermediate layer 320 includes a low molecular weight material, the intermediate layer 320 may have a structure in which a hole injection layer (HIL), a hole transport layer (HTL), an emission layer (EML), an electron transport layer (ETL), electron Injection layer (EIL), and the like are stacked in a single or a composite structure, and may include copper phthalocyanine (CuPc), N, N'-di (naphthalen-1-yl)-N, N'-diphenyl-benzidine (NPB), tris-8-hydroxyquinoline aluminum (Alq3), and the like. These layers may be formed by a method of vacuum deposition.

When the intermediate layer 320 includes a high molecular weight material, for example, a polymer material, the intermediate layer 320 may have a structure including an HTL and an EML. In this case, the HTL may include ethylenedioxythiophene (PEDOT), and the EML may include a polymer material such as poly-phenylenevinylene (PPV) and polyfluorene. In an implementation, at least one layer constituting the intermediate layer 320 may be integrally formed over a plurality of pixel electrodes 310. Alternatively, the intermediate layer 320 may include a patterned layer corresponding to each of the plurality of pixel electrodes 310.

The counter electrode 330 may be arranged on a display area DA and may be arranged to cover the display area DA. For example, the counter electrode 330 may be integrally formed to cover a plurality of pixels.

Referring to FIG. 6, a display device 2 may have a display area DA and a peripheral area PA. In an implementation, as illustrated in FIG. 6, a CMOS device including the first thin film transistor TR1 and the second thin film transistor TR2 may be provided in the outer area PA instead of the display area DA. This is different from that of FIG. 5 described above. Therefore, descriptions already given with reference to points overlapping with those in FIG. 5 with respect to the display area DA may be omitted and differences will be mainly described below.

The CMOS device including the first thin film transistor TR1 and the second thin film transistor TR2 may be arranged in a driving circuit region DC-A of the peripheral area PA. A common power supply wiring 190 may be located on one side of the drive circuit region DC-A. As described above, the first thin film transistor TR1 may include a first active pattern 120 and the second thin film transistor TR2 may include a second active pattern 130. Referring to an enlarged view of FIG. 5, an upper surface of the first active pattern 120 is flat, while an upper surface of the second active pattern 130 may include a plurality of protrusions B. One of the first thin film transistor TR1 and the second thin film transistor TR2 may be a PMOS transistor and the other may be an NMOS transistor. In FIG. 5, the second active pattern 130 is illustrated as having a plurality of protrusions B. The second thin film transistor TR2 including the second active pattern 130 may be a PMOS transistor or an NMOS transistor.

As a comparative example, as shown in FIG. 1, when the first and second thin film transistors TR1 and TR2 are formed while leaving a plurality of first and second protrusions 120B and 130B formed on the upper surfaces of the first and second active patterns 120 and 130 as they are, a dopant may not be evenly injected in the first and second active patterns 120 and 130 in a subsequent doping process due to a thickness difference in the active patterns caused by the protrusions, and a barrier in the active patterns formed thereby or the short range uniformity (SRU) characteristic in the device could be degraded. In an implementation, the PMOS or NMOS transistor constituting the CMOS device may have a protrusion formed on an upper surface of an active pattern in some cases, thereby improving the device characteristics. For example, a PMOS transistor and an NMOS transistor may constitute one CMOS device and one of them may be selectively provided with protrusions, or the protrusions may be selectively removed.

Accordingly, in the process of forming the first and second active patterns 120 and 130 in the display devices 1 and 2 according to an embodiment of the present disclosure, a plurality of protrusions B formed on the upper surfaces of the first and second active patterns 120 and 130 may be selectively removed (e.g., from the first active pattern 120) as desired through the masking layer 112 of FIG. 2.

By way of summation and review, the PMOS thin film transistor and the NMOS thin film transistor may be formed on one substrate, in order to implement the CMOS thin film transistor, and a relatively large number of process steps may be performed.

In addition, the PMOS or NMOS thin film transistor constituting the CMOS thin film transistor may include an active pattern for providing a channel region, a source region and a drain region, and a gate electrode electrically insulated from the active pattern by a gate insulating layer, and the active pattern of the PMOS or NMOS thin film transistor may be formed of a semiconductor layer such as amorphous silicon or polysilicon.

For example, the active pattern may be made of amorphous silicon, and it could be difficult to realize a driving circuit that operates at a high speed due to low mobility. On the other hand, the active pattern may be formed of polysilicon, mobility may be high and the threshold voltage may be uneven due to the polycrystalline nature, and a compensation circuit may be used to compensate for the dispersion of the threshold voltage and the mobility, thereby lowering the yield. In addition, the number of masks may increase as compared with the case of amorphous silicon due to a coplanar structure, which may increase manufacturing costs.

The embodiments may provide a method of simplifying a manufacturing process while maintaining the performance in realizing the CMOS thin film transistor.

The embodiments may provide a thin film transistor substrate having improved device characteristics.

According to an embodiment of the present disclosure as described above, a thin film transistor substrate having improved device characteristics, a display device having the same, a method of manufacturing a thin film transistor substrate, and a method of manufacturing a display device may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor substrate, comprising:
   a substrate;
   a first thin film transistor on the substrate, the first thin film transistor including:
      a first active pattern, wherein all protrusions in an upper surface of the first active pattern are less than about 100 Å, and
      a first gate electrode arranged to overlap at least a part of the first active pattern; and
   a second thin film transistor on the substrate, the second thin film transistor including:
      a second active pattern that includes a plurality of protrusions on an upper surface thereof, wherein a height of each protrusion of the plurality of protrusions on the upper surface of the second active pattern is from about 300 Å to about 800 Å, and
      a second gate electrode arranged to overlap at least a part of the second active pattern, wherein
   one of the first thin film transistor and the second thin film transistor is a driving transistor, and
   the other of the first thin film transistor and the second thin film transistor is a switching transistor.

2. The thin film transistor substrate as claimed in claim 1, wherein:
   one of the first thin film transistor and the second thin film transistor is a P-type transistor, and
   the other of the first thin film transistor and the second thin film transistor is an N-type transistor.

3. The thin film transistor substrate as claimed in claim 1, wherein the first thin film transistor and the second thin film transistor constitute a CMOS device.

4. The thin film transistor substrate as claimed in claim 1, further comprising a gate insulating layer on the substrate, wherein the gate insulating layer is between the first active pattern and the first gate electrode.

5. The thin film transistor substrate as claimed in claim 1, wherein the upper surface of the first active pattern is flat relative to the upper surface of the second active pattern.

6. The thin film transistor substrate as claimed in claim 1, wherein the first active pattern includes a plurality of fine protrusions on an upper surface thereof.

7. The thin film transistor substrate as claimed in claim 1, wherein the first active pattern and the second active pattern include polysilicon.

8. A display device, comprising:
   the film transistor substrate as claimed in claim 1;
   a pixel electrode electrically connected to the first thin film transistor or the second thin film transistor of the thin film transistor substrate;
   an emission layer arranged on the pixel electrode; and
   a counter electrode arranged on the emission layer.

9. A method of manufacturing a thin film transistor substrate, the method comprising:
   forming a first active pattern and a second active pattern on a substrate;
   forming a plurality of first protrusions on an upper surface of the first active pattern and forming a plurality of second protrusions on an upper surface of the second active pattern by irradiating a laser beam onto the first active pattern and the second active pattern, wherein a height of each protrusion of the plurality of protrusions on the upper surface of both the first active pattern and the second active pattern is from about 200 Å to about 800 Å;
   forming a masking layer on the second active pattern to cover the second active pattern;
   removing the plurality of first protrusions on an exposed upper surface of the first active pattern such that the first active pattern includes no protrusions on an upper surface thereof that exceeds about 100 Å;
   forming a first gate electrode overlapping at least parts of the first active pattern; and
   forming a second gate electrode overlapping at least parts of the second active pattern, wherein:

one of the first active pattern and the second active pattern is doped with a P-type dopant, and the other of the first active pattern and the second active pattern is doped with an N-type dopant.

10. The method as claimed in claim 9, further comprising:

forming a first thin film transistor using the first active pattern; and forming a second thin film transistor using the second active pattern.

11. The method as claimed in claim 10, wherein:

one of the first thin film transistor and the second thin film transistor is a driving transistor, and the other of the first thin film transistor and the second thin film transistor is a switching transistor.

12. A method of manufacturing a display device, the method comprising:

manufacturing a thin film transistor substrate by using the method of manufacturing the thin film transistor substrate as claimed in claim 10;

forming a pixel electrode electrically connected to the first thin film transistor or the second thin film transistor of the thin film transistor substrate;

forming an intermediate layer on the pixel electrode, the intermediate layer including an emission layer; and forming a counter electrode on the intermediate layer.

13. The method as claimed in claim 9, further comprising forming a gate insulating layer on the substrate, wherein the gate insulating layer is between the first active pattern and the first gate electrode.

14. The method as claimed in claim 9, wherein removing the plurality of first protrusions includes performing an etching process.

15. The method as claimed in claim 9, wherein removing the plurality of first protrusions includes performing a CMP process.

16. The method as claimed in claim 9, wherein removing the plurality of first protrusions includes forming a plurality of fine protrusions having a height of about 100 Å or less on the upper surface of the first active pattern.

* * * * *